US012623256B2

(12) United States Patent (10) Patent No.: US 12,623,256 B2
Sumi (45) Date of Patent: May 12, 2026

(54) SUBSTRATE PROCESSING METHOD AND SUBSTRATE PROCESSING APPARATUS

(71) Applicant: SCREEN Holdings Co., Ltd., Kyoto (JP)

(72) Inventor: Noritake Sumi, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 145 days.

(21) Appl. No.: 18/551,567

(22) PCT Filed: Mar. 16, 2022

(86) PCT No.: PCT/JP2022/011882
§ 371 (c)(1),
(2) Date: Sep. 20, 2023

(87) PCT Pub. No.: WO2022/202528
PCT Pub. Date: Sep. 29, 2022

(65) Prior Publication Data
US 2024/0173753 A1 May 30, 2024

(30) Foreign Application Priority Data

Mar. 23, 2021 (JP) ................................. 2021-048372

(51) Int. Cl.
*H01L 21/02* (2006.01)
*B08B 3/10* (2006.01)
*H01L 21/67* (2006.01)

(52) U.S. Cl.
CPC .......... *B08B 3/10* (2013.01); *H01L 21/02057* (2013.01); *H01L 21/02101* (2013.01); *H01L 21/67034* (2013.01)

(58) Field of Classification Search
CPC ................................................ H01L 21/02101
See application file for complete search history.

(56) References Cited

U.S. PATENT DOCUMENTS 6,493,964 B1 * 12/2002 Tousimis ................. G01N 1/40
34/558
2011/0247662 A1 10/2011 Kamikawa
(Continued)

FOREIGN PATENT DOCUMENTS

JP H10227580 A * 8/1998
JP 2010-174071 A 8/2010
(Continued)

OTHER PUBLICATIONS

International Search Report mailed Jun. 7, 2022 in corresponding PCT International Application No. PCT/JP2022/011882.
(Continued)

*Primary Examiner* — Kaj K Olsen
*Assistant Examiner* — Richard Z. Zhang
(74) *Attorney, Agent, or Firm* — OSTROLENK FABER LLP

(57) ABSTRACT

A substrate processing method according to the invention includes a supercritical process step of processing a substrate by a processing fluid in a supercritical state by introducing the processing fluid into an internal space of the chamber accommodating the substrate, a decompression step of decompressing the internal space by discharging the processing fluid, a carry-out step of carrying out the substrate from the chamber, and a temperature adjustment step of adjusting a temperature of the internal space to a target temperature by introducing and discharging the processing fluid to and from the internal space after the substrate is carried out. Stable processing efficiency can be obtained also particularly in the case of processing a plurality of substrates in turn by properly controlling a temperature in a chamber after a process in a technique for processing a substrate by a processing fluid in a supercritical state in the chamber.

6 Claims, 5 Drawing Sheets

(56)            References Cited

U.S. PATENT DOCUMENTS

2013/0318815 A1 *   12/2013   Kim ...................... B08B 7/0021
                                                   34/487
2015/0135549 A1     5/2015   Sato et al.
2017/0250094 A1     8/2017   Verhaverbeke et al.
2018/0138058 A1     5/2018   Egashira et al.
2021/0050210 A1 *   2/2021   Seo ................... H01L 21/02057

FOREIGN PATENT DOCUMENTS

JP        2011-222696 A    11/2011
JP        2011-222697 A    11/2011
JP        2018-81966 A     5/2018

OTHER PUBLICATIONS

Taiwan Office Action mailed Oct. 24, 2022, in corresponding Taiwanese Application No. 111110320.

* cited by examiner

F I G. 1
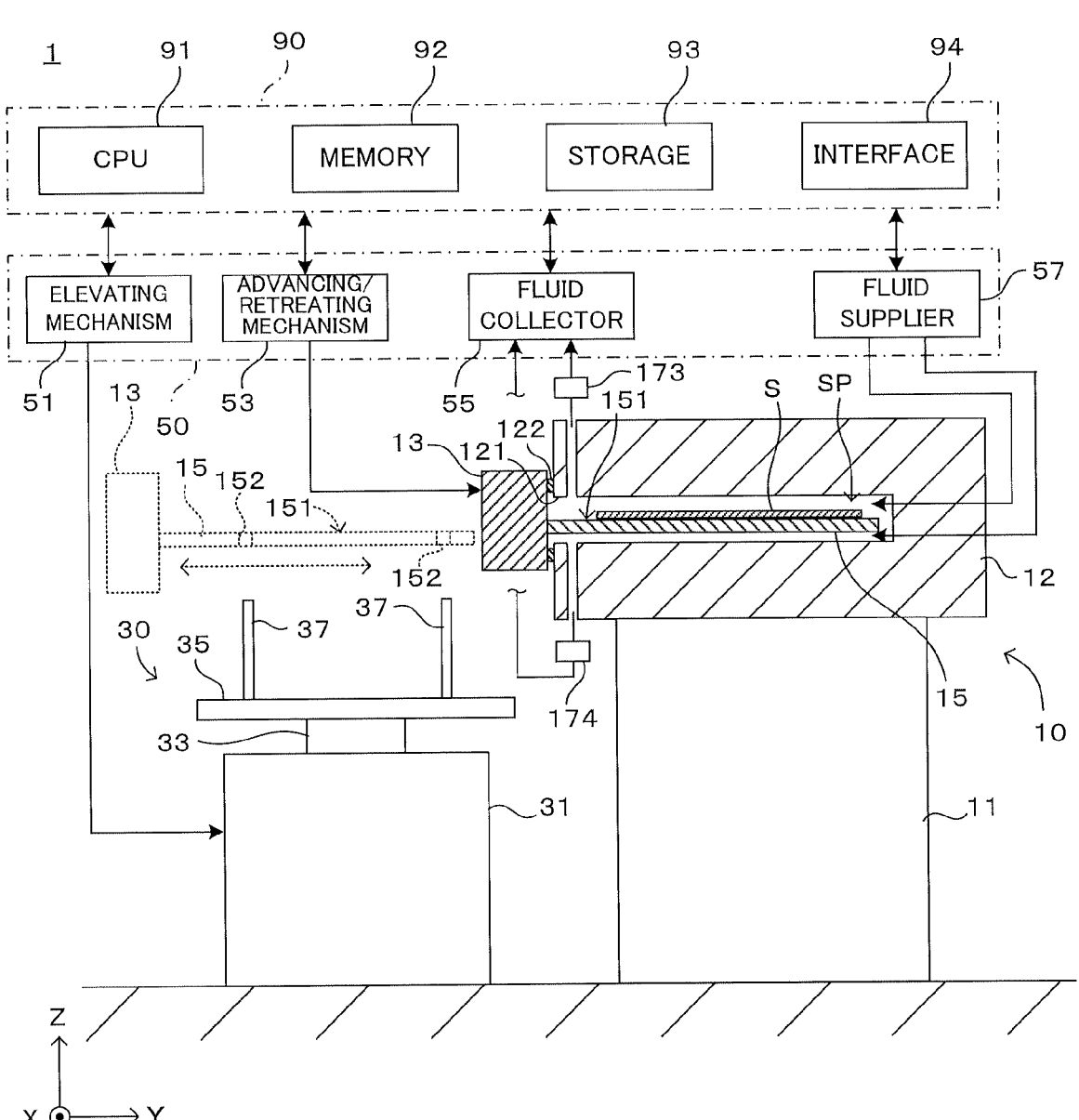

F I G. 2
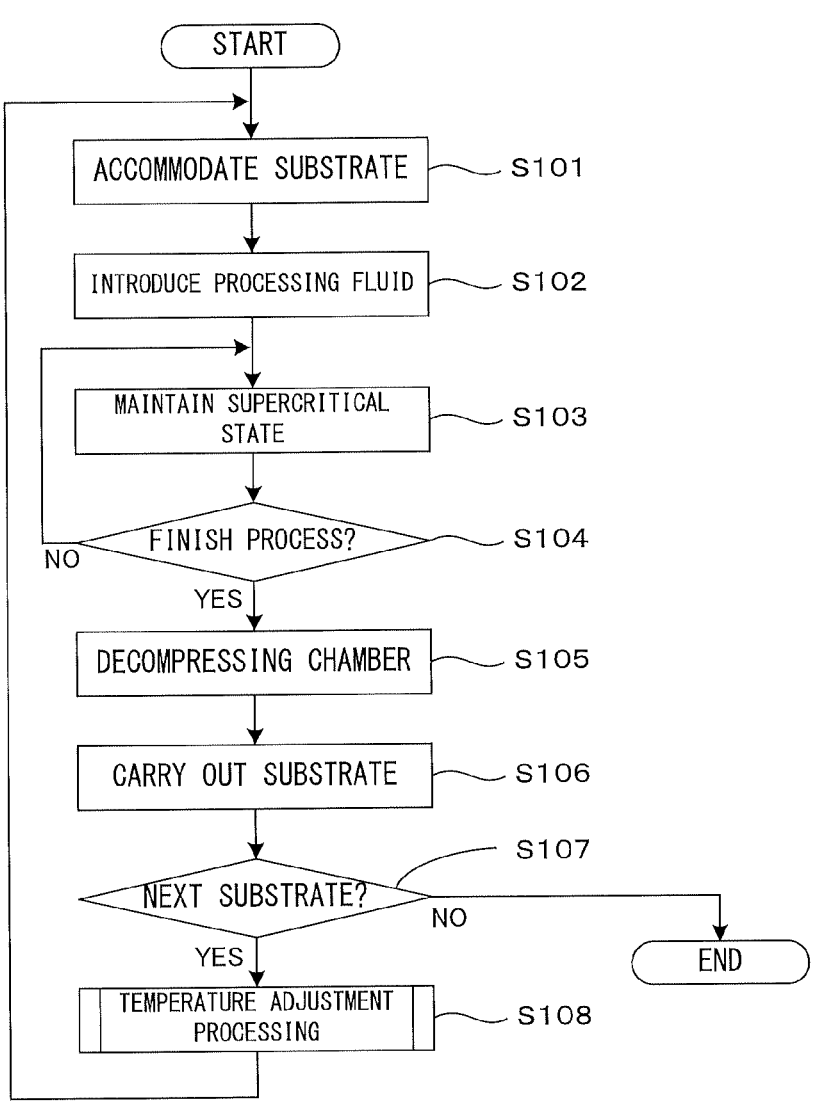

F I G. 3 A
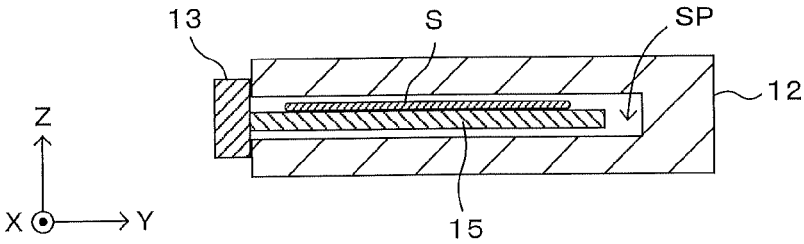
F I G. 3 B
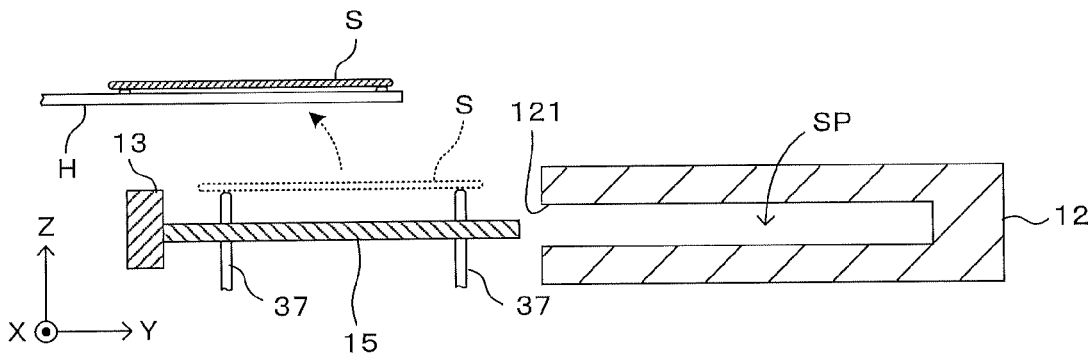
F I G. 3 C
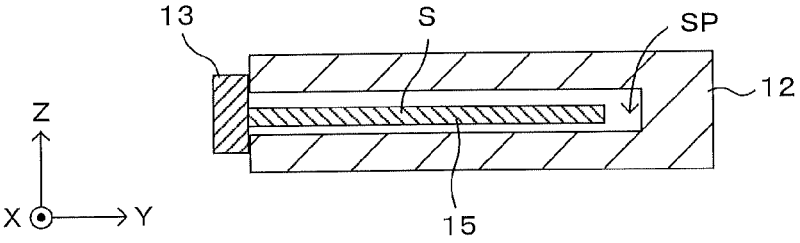
F I G. 3 D
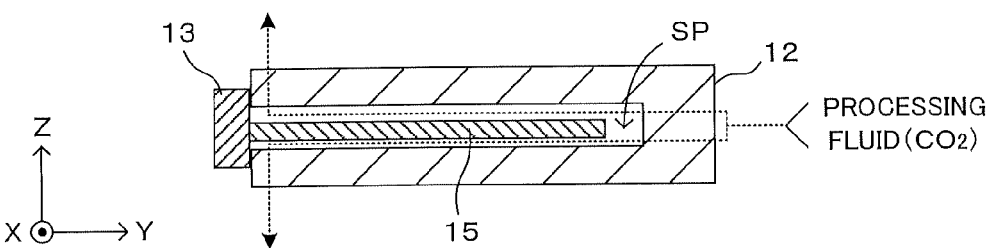

F I G. 4
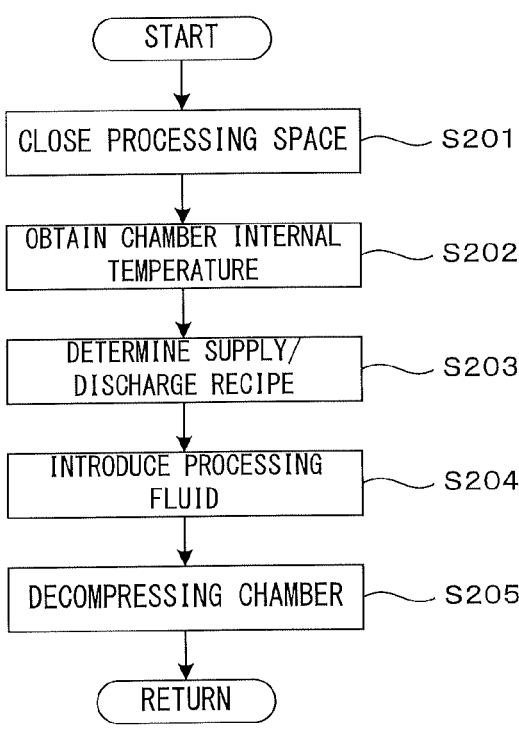
START
CLOSE PROCESSING SPACE — S201
OBTAIN CHAMBER INTERNAL TEMPERATURE — S202
DETERMINE SUPPLY/ DISCHARGE RECIPE — S203
INTRODUCE PROCESSING FLUID — S204
DECOMPRESSING CHAMBER — S205
RETURN

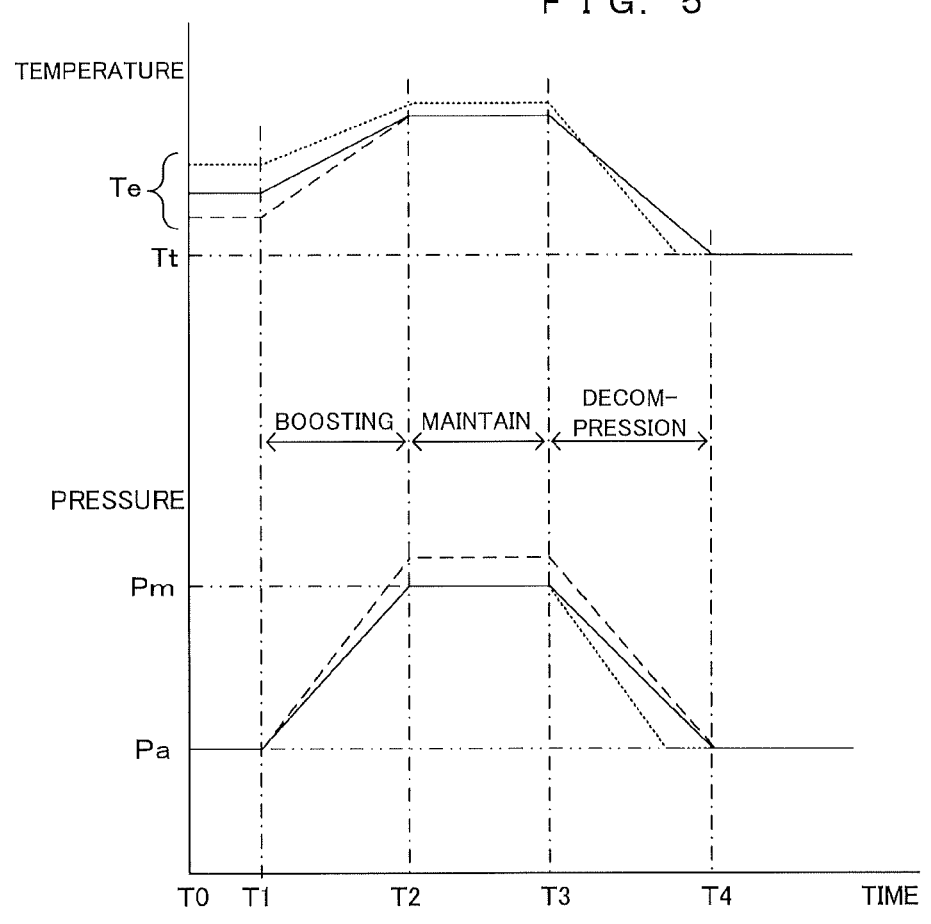
F I G.  5

SUBSTRATE PROCESSING METHOD AND SUBSTRATE PROCESSING APPARATUS

CROSS REFERENCE TO RELATED APPLICATION

The disclosure of Japanese Patent Application No. 2021-048372 filed on Mar. 23, 2021 including specification, drawings and claims is incorporated herein by reference in its entirety.

TECHNICAL FIELD

This invention relates to a technique for processing a substrate by a processing fluid in a supercritical state in a chamber and particularly to a process after the substrate is processed with the supercritical processing fluid.

BACKGROUND ART

The process of processing various substrates such as a semiconductor substrate and a glass substrate for a display apparatus includes processing the surface of the substrate with various processing fluids. Although processing using liquids such as chemicals and rinses as the processing fluids has been widely performed in the past, processing using supercritical fluids has been put into practical use in recent years. In particular, in the processing of a substrate having a fine pattern formed on its surface, a supercritical fluid having a lower surface tension than a liquid penetrates deep into gaps among the pattern, whereby the processing may be performed efficiently. In addition, the risk of pattern collapse due to the surface tension may be reduced in a drying process.

A substrate processing apparatus for drying a substrate by replacing a liquid adhering to the substrate by a supercritical fluid is described, for example, in PTL 1. More specifically, a flow of a drying process in the case of using carbon dioxide as a supercritical fluid and IPA (isopropyl alcohol) as a liquid to be replaced by carbon dioxide is described in detail in PTL 1. In this process, the inside of a chamber accommodating the substrate is filled with the processing fluid and a condition exceeding critical pressure and critical temperature of the processing fluid in the chamber is kept for a certain period. Thereafter, the inside of the chamber is decompressed and a series of processing ends.

CITATION LIST

Patent Literature

PTL 1: JP 2018-081966A

SUMMARY

Technical Problem

In the above conventional technique, the supercritical state is maintained mainly by a pressure control of repeating pressure increase and pressure reduction. However, the temperature and the pressure of the supercritical fluid during the processing are more preferably kept constant. The reason for that is that, since a density change particularly associated with a temperature change is very large in the supercritical fluid, processing efficiency is largely changed by a density of the processing fluid in a processing for the purpose of liquid replacement. More particularly, the higher density the supercritical processing fluid is, the more the other liquid can be taken. Thus, the replacement efficiency of the liquid increases. The lower the temperature, the higher the density of the supercritical processing fluid. Thus, the processing fluid preferably has as low and constant a temperature as possible within a range in which the supercritical state can be maintained.

The temperature of the processing fluid is affected also by a chamber internal temperature when the processing fluid is introduced into the chamber. Thus, the temperature in the chamber at the time of introducing the processing fluid is also required to be constantly and properly kept. However, this point is not considered in the above conventional technique, and the chamber internal temperature is not managed at timings other than during the processing, particularly in a decompression process. Thus, particularly in the case of successively processing a plurality of substrates, the next substrate and the processing fluid may be possibly introduced into the chamber having reached a high temperature by the processing of the previous substrate. In this way, processing efficiency may be reduced or processing results may vary.

Solution to Problem

This invention was developed in view of the above problem and aims to provide a technique capable of obtaining stable processing efficiency also particularly in the case of processing a plurality of substrates in turn by properly controlling a temperature in a chamber after a process in a technique for processing a substrate by a processing fluid in a supercritical state in the chamber.

One aspect of this invention is directed to a substrate processing method for processing a substrate by a processing fluid in a supercritical state in a chamber, the substrate processing method including a supercritical process step of processing the substrate by the processing fluid in the supercritical state by introducing the processing fluid into an internal space of the chamber accommodating the substrate, a decompression step of decompressing the internal space by discharging the processing fluid, a carry-out step of carrying out the substrate from the chamber, and a temperature adjustment step of adjusting a temperature of the internal space to a target temperature by introducing and discharging the processing fluid into and from the internal space after the substrate is carried out.

Further, another aspect of this invention is directed to a substrate processing apparatus for processing a substrate by a processing fluid in a supercritical state, the substrate processing apparatus including a chamber capable of accommodating the substrate in an internal space, a fluid supplier for supplying the processing fluid into the internal space of the chamber, a fluid discharger for discharging the processing fluid from the internal space and a controller for controlling the fluid supplier and the fluid discharger, the controller performing a temperature adjustment processing of adjusting a temperature of the internal space to a target temperature by causing the fluid supplier to supply the processing fluid into the internal space and the fluid discharger to discharge the processing fluid from the internal space after the substrate processed by the processing fluid is carried out.

The "temperature of the internal space" mentioned here is a concept indicating a temperature detected when a temperature measurement is conducted in this space, specifically indicates a temperature of a wall surface of the chamber facing the internal space. The reason for this is described later.

The inside of the chamber has a high temperature in a substrate processing by the processing fluid in the super-critical state. In this way, the temperature may not drop sufficiently even after the processing fluid is discharged. Particularly, in processes not taking into consideration a temperature control in the chamber at the end of the process, the temperature may be different for each process. Then, if a plurality of substrates are successively conveyed into the chamber and consecutively processed, processing results possibly vary due to differences in initial temperature.

In view of this, in the invention configured as described above, the temperature of the internal temperature is adjusted to the target temperature by introducing the processing fluid again into the internal space of the chamber after the substrate is processed by the processing fluid. Since the temperature after the process is finished for one substrate is controlled in this way, the next substrate can be successively immediately carried into the chamber. In this way, a throughput of the process for a plurality of substrates can be improved.

Further, since the initial temperature in the process for each substrate is stable, processing results can also be stable. This is because the density of the supercritical fluid largely changes with respect to temperature and processing efficiency largely differs due to a density difference. In the invention, by stabilizing the initial temperature, it can be suppressed that a temperature change in the process thereafter varies for each process and stable processing results can be obtained.

Advantageous Effects of Invention

As described above, in the invention, the processing fluid is introduced into and discharged from the chamber again for the purpose of adjusting the temperature in the chamber after the process for the substrate is finished. Thus, the temperature in the chamber before the next substrate is carried in can be properly controlled. Particularly, also in the case of processing a plurality of substrates in turn, stable processing efficiency can be obtained by suppressing a temperature variation of the supercritical processing fluid for each process.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF DRAWINGS

FIG. 1 is a drawing showing a schematic configuration of a substrate processing apparatus according to the present invention.

FIG. 2 is a flow chart showing a summary of a process performed by this substrate processing apparatus.

FIG. 3A is a diagram schematically showing the operation of each component in the supercritical process.

FIG. 3B is a diagram schematically showing the operation of each component in the supercritical process.

FIG. 3C is a diagram schematically showing the operation of each component in the supercritical process.

FIG. 3D is a diagram schematically showing the operation of each component in the supercritical process.

FIG. 4 is a flow chart showing the temperature adjustment processing.

FIG. 5 is a chart schematically showing pressure and temperature changes in the chamber in the temperature adjustment processing.

DESCRIPTION OF EMBODIMENTS

FIG. 1 is a drawing showing a schematic configuration of a substrate processing apparatus according to the present invention. This substrate processing apparatus 1 is an apparatus for processing surfaces of various substrates such as semiconductor substrates using supercritical fluids. Its device construction is preferably capable of performing a substrate processing method according to the present invention. To show directions in each figure in a unified manner below, an XYZ orthogonal coordinate system is set as shown in FIG. 1. Here, an XY plane represents a horizontal plane and a Z direction represents a vertical direction. More specifically, a (−Z) direction represents a vertically downward direction.

Various substrates such as semiconductor wafers, glass substrates for photomask, glass substrates for liquid crystal display, glass substrates for plasma display, substrates for FED (Field Emission Display), substrates for optical disk, substrates for magnetic disk, and substrates for magneto-optical disk can be adopted as the "substrate" in this embodiment. A substrate processing apparatus used to process a disk-shaped semiconductor wafer is mainly described as an example with reference to the drawings. But the substrate processing apparatus can be adopted also to process various substrates illustrated above. Also as a shape of the substrate, various types are applicable.

The substrate processing apparatus 1 includes a processing unit 10, a transfer unit 30, a supply unit 50 and a control unit 90. The processing unit 10 serves as an execution subject of a supercritical drying process. The transfer unit 30 receives an unprocessed substrate S transported by an external conveying device not shown in the figure and carries the substrate S into the processing unit 10. Further, the transfer unit 30 delivers a processed substrate S from the processing unit 10 to the external conveying device. The supply unit 50 supplies chemical substances, power, energy and the like necessary for the process to the processing unit 10 and the transfer unit 30.

The control unit 90 realizes a predetermined process by controlling these components of the apparatus. For this purpose, the control unit 90 includes a CPU 91, a memory 92, a storage 93, an interface 94, and the like. The CPU 91 executes various control programs. The memory 92 temporarily stores processing data. The storage 93 stores the control programs to be executed by the CPU 91. The interface 94 exchanges information with a user and an external apparatus. Operations of the apparatus to be described later are realized by the CPU 91 causing each component of the apparatus to perform a predetermined operation by executing the control program written in the storage 93 in advance.

The processing unit 10 has a structure in which a processing chamber 12 is settled on a pedestal 11. The processing chamber 12 is structured by a combination of several metal blocks which form a hollow inside serving as a processing space SP. A substrate S to be processed is carried into the processing space SP to be processed. A slit-like aperture 121 elongated in an X direction is formed in a (−Y)

side surface of the processing chamber 12. The processing space SP communicates with an outside space via the aperture 121. A cross-sectional shape of the internal space SP is roughly the same as a shape of the opening 121. That is, the processing SP is a hollow having a cross-sectional shape that is long in the X direction and short in the Z direction and elongated in the Y direction.

A lid member 13 is provided on the (−Y) side surface of the processing chamber 12 to close the aperture 121. A hermetic processing chamber is constructed by closing the aperture 121 of the processing chamber when the aperture 121 is closed by the lid member 13. By doing so, a processing to the substrate S under a high pressure in the internal processing space SP is allowed. A support tray 15 in the form of a flat plate is attached in a horizontal posture to a (+Y) side surface of the lid member 13. An upper surface 151 of the support tray 15 serves as a support surface on which the substrate S can be placed. The lid member 13 is supported horizontally movably in a Y direction by an unillustrated support mechanism.

The lid member 13 is movable toward and away from the processing chamber 12 by an advancing/retreating mechanism 53 provided in the supply unit 50. Specifically, the advancing/retreating mechanism 53 includes a linear motion mechanism such as a linear motor, a linear guide, a ball-screw mechanism, a solenoid or an air cylinder. Such a linear motion mechanism moves the lid member 13 in the Y direction. The advancing/retreating mechanism 53 operates in response to a control command from the control unit 90.

By a movement of the lid member 13 in a (−Y) direction, the lid member 13 separates away from the processing chamber 12. If the support tray 15 is pulled out from the processing space SP to outside via the aperture 121 as shown by the dotted lines, the support tray 15 is accessible from outside. Specifically, it becomes possible to place the substrate S on the support tray 15 and take out the substrate S placed on the support tray 15. On the other hand, the lid member 13 moves in a (+Y) direction, whereby the support tray 15 is accommodated into the processing space SP. If the substrate S is placed on the support tray 15, the substrate S is carried into the processing space SP together with the support tray 15.

The lid member 13 moves in the (+Y) direction to close the aperture 121, whereby the processing space SP is sealed. A sealing member 122 is provided between the (+Y) side surface of the lid member 13 and the (−Y) side surface of the processing chamber 12 and an airtight state of the processing space SP is maintained. The seal member 12 is made of rubber material, for example. Further, the lid member 13 is fixed to the processing chamber 12 by an unillustrated lock mechanism. As described above, in this embodiment, the lid member 13 is switched between a closing state (solid line) to close the aperture 121 and seal the processing space SP and a separating state (dotted line) to enable the substrate S to pass through by separating widely from the aperture 121.

The substrate S is processed in the processing space SP with the airtight state of the processing space SP ensured. In this embodiment, a fluid of a substance usable for a supercritical process, e.g. carbon dioxide, is sent from a fluid supplier 57 provided in the supply unit 50 as the processing fluid. The processing fluid is supplied to the processing unit 10 in a gaseous, liquid or supercritical state. Carbon dioxide is a chemical substance suitable for the supercritical drying process in having properties of entering a supercritical state at relatively low temperature and low pressure and dissolving an organic solvent often used in substrate processing well. At a critical point of carbon dioxide at which the fluid comes into the supercritical state, a pressure (critical pressure) is 7.38 MPa and a temperature (critical temperature) is 31.1° C.

The processing fluid is filled into the processing space SP. When suitable temperature and pressure are reached in the processing space SP, the processing space SP is filled with the processing fluid in the supercritical state. In this way, the substrate S is processed by the supercritical fluid in the processing chamber 12. The supply unit 50 is provided with a fluid collector 55, and the fluid after the process is collected into the fluid collector 55. The fluid supplier 57 and the fluid collector 55 are controlled by the control unit 90.

The processing space SP has a shape and a volume capable of receiving the support tray 15 and the substrate S supported by the support tray 15. That is, the processing space SP has a substantially rectangular cross-sectional shape wider than a width of the support tray 15 in a horizontal direction and larger than the sum of heights of the support tray 15 and the substrate S in the vertical direction and has a depth capable of receiving the support tray 15. As just described, the processing space SP has a shape and a volume enough to receive the support tray 15 and the substrate S. However, gaps between the support tray 15 and the substrate S and the inner wall surface of the processing space SP are tiny. Therefore, the amount of the processing fluid necessary to fill the processing space SP is relatively small.

With the support tray 15 accommodated in the processing space SP, the processing space SP is largely divided into two, i.e. spaces above and below the support tray 15. If the substrate S is placed on the support tray 15, the processing space SP is divided into a space above the upper surface of the substrate S and a space below the lower surface of the support tray 15.

The fluid supplier 57 supplies the processing fluid to each of the space above the substrate S and the space below the support tray 15, out of the processing space SP, on a (+Y) side further than a (+Y) side end part of the substrate S. On the other hand, the fluid collector 55 discharges the processing fluid from each of the space above the substrate S and the space below the support tray 15, out of the processing space SP, on a (−Y) side further than a (−Y) side end part of the substrate S. In this way, laminar flows of the processing fluid from the (+Y) side toward the (−Y) side are respectively formed above the substrate S and below the support tray 15 in the processing space SP.

Detectors 173, 174 for detecting a pressure and a temperature of the processing fluid discharged from the processing space SP are provided in pipes serving as discharge paths of the processing fluid from the processing space SP to the fluid collector 55. Specifically, the first detector 173 is provided in the pipe communicating with a space above the support tray 15, out of the processing space SP, and configured to discharge the processing fluid from this space. Further, the second detector 174 is provided in the pipe communicating with a space below the support tray 15 and configured to discharge the processing fluid from this space.

The detectors 173, 174 are for detecting the pressure and temperature of the processing space SP. In this sense, the detectors 173, 174 are desirably provided inside the processing space SP. Particularly for the temperature, it is ideal if the temperature of a chamber inner wall surface facing the processing space SP can be detected. However, it has to be avoided that the detectors 173, 174 hinder a smooth flow of the processing fluid or become a contamination source for the processing fluid. Thus, as a simple alternative method, the detectors 173, 174 are provided in processing fluid flow passages communicating with the processing space SP on a side downstream of the substrate S in a flowing direction of the processing fluid. That is, pressure and temperature detection results of the processing fluid flowing in these flow passages are regarded as the pressure and temperature of the processing space SP.

To this end, the pipes constituting the flow passages of the processing fluid from the processing space SP to the detectors 173, 174 desirably have a small pressure loss. Further, detectors may be arranged to directly face the processing space SP as long as these do not affect the flow of the processing fluid.

The control unit 90 specifies the pressure and temperature in the processing space SP based on outputs of the detectors 173, 174, and controls the fluid supplier 57 and the fluid collector 55 based on those results. In this way, the supply of the processing fluid into the processing space SP and the discharge of the processing fluid from the processing space SP are properly managed. As a result, the pressure and temperature in the processing space SP are adjusted according to a processing recipe determined in advance.

The transfer unit 30 transfers the substrate S between an external conveying device and the support tray 15. To this end, the transfer unit 30 is provided with a body 31, an elevating member 33, a base member 35 and a plurality of lift pins 37. The elevating member 33 is a columnar member extending in the Z direction, and supported movably in the Z direction with respect to the body 31 by an unillustrated supporting mechanism. The base member 35 having a substantially horizontal upper surface is mounted atop the elevating member 33. The plurality of lift pins 37 stand upward from the upper surface of the base member 35. Each of the lift pins 37 supports the substrate S in a horizontal posture from below by the contact of an upper end part thereof with the lower surface of the substrate S. To stably support the substrate S in the horizontal posture, it is desirable to provide three or more lift pins 37 having the upper end parts located at the same height.

The elevating member 33 is movable up and down by an elevating mechanism 51 provided in the supply unit 50. Specifically, the elevating mechanism 51 includes a linear motion mechanism such as a linear motor, a linear motion guide, a ball screw mechanism, a solenoid or an air cylinder, and such a linear motion mechanism moves the elevating member 33 in the Z direction. The elevating mechanism 51 operates in response to a control command from the control unit 90.

The base member 35 is moved up and down by upward and downward movements of the elevating member 33, and the plurality of lift pins 37 are moved up and down integrally with the base member 35. In this way, the transfer of the substrate S between the transfer unit 30 and the support tray 15 is realized. More specifically, as shown by dotted lines in FIG. 1, the substrate S is transferred with the support tray 15 pulled out to the outside of the chamber. To this end, the support tray 15 is provided with through holes 152, through which the lift pins 37 are inserted. If the base member 35 moves up, the upper ends of the lift pins 37 reach positions above the upper surface 151 of the support tray 15 through the through holes 152. In this state, the substrate S being conveyed by the external conveying device is transferred to the lift pins 37. The lift pins 37 move down, whereby the substrate S is transferred from the lift pins 37 to the support tray 15. The substrate S can be carried out in a procedure opposite to the above one.

FIG. 2 is a flow chart showing a summary of a process performed by this substrate processing apparatus. This substrate processing apparatus 1 performs a supercritical drying process, i.e. a process of drying the substrate S cleaned with a cleaning liquid in a previous process. Specifically, this process is as follows. The substrate S to be processed is cleaned with the cleaning liquid in the previous process performed in another substrate processing apparatus constituting a substrate processing system. Thereafter, the substrate S is conveyed to the substrate processing apparatus 1 with a liquid film by an organic solvent such as isopropyl alcohol (IPA) formed on a surface.

For example, if a fine pattern is formed on the surface of the substrate S, the pattern may collapse due to surface tension of the liquid remaining on and adhering to the substrate S. Further, watermarks may remain on the surface of the substrate S due to incomplete drying. Further, the surface of the substrate S may be altered such as through oxidation by being exposed to outside air. To prevent such problems, the substrate S may be conveyed with the surface (pattern forming surface) of the substrate S covered by a liquid or solid surface layer.

For example, if the cleaning liquid contains water as a main component, conveyance is carried out with the liquid film formed by a liquid having a lower surface tension than the cleaning liquid and low corrosiveness to the substrate, e.g. an organic solvent such as IPA or acetone. That is, the substrate S is conveyed to the substrate processing apparatus 1 while being supported in a horizontal state and having the liquid film formed on the upper surface thereof. Here, it is assumed that IPA is used as an example of the liquid film material.

The substrate S conveyed by the unillustrated conveying device is accommodated into the processing chamber 12 (Step S101). Specifically, the substrate S is conveyed with the pattern forming surface serving as the upper surface and the upper surface covered by a thin liquid film. As shown by dotted lines in FIG. 1, the lift pins 37 move up with the lid member 13 moved to the (−Y) side and the support tray 15 pulled out. The conveying device transfers the substrate S to the lift pins 37. The lift pins 37 move down, whereby the substrate S is placed on the support tray 15. When the support tray 15 and the lid member 13 integrally move in the (+Y) direction, the support tray 15 supporting the substrate S is accommodated into the processing space SP in the processing chamber 12 and the opening 121 is closed by the lid member 13.

In this state, carbon dioxide serving the processing fluid is introduced in a gas phase state into the processing space SP (Step S102). Outside air enters the processing space SP when the substrate S is carried in, but it can be replaced by introducing the processing fluid in the gas phase. Further, by injecting the processing fluid in the gas phase, a pressure in the processing chamber 12 increases.

Note that, in the process of introducing the processing fluid, the processing fluid is continually discharged from the processing space SP. That is, the processing fluid is discharged from the processing space SP by the fluid collector 55 also while the processing fluid is being introduced by the fluid supplier 57. In this way, the processing fluid used for the process is discharged without convection in the processing space SP, thereby preventing impurities such as the remaining liquid taken into the processing fluid from adhering to the substrate S again.

If the supply amount of the processing fluid is more than the discharge amount, the density of the processing fluid in the processing space SP increases and the chamber internal pressure increases. Conversely, if the supply amount of the processing fluid is less than the discharge amount, the density of the processing fluid in the processing space SP decreases and the inside of the chamber is decompressed. The supply of the processing fluid into the processing chamber 12 and the discharge thereof from the processing chamber 12 are performed based on a supply/discharge recipe prepared in advance. That is, the control unit 90 controls the fluid supplier 57 and the fluid collector 55 based on the supply/discharge recipe, whereby supply and discharge timings, flow rates and the like of the processing fluid are adjusted.

If the pressure of the processing fluid in the processing space SP increases and exceeds a critical pressure, the processing fluid enters a supercritical state in the chamber. That is, due to a phase change in the processing space SP, the processing fluid transitions from the gas phase to the supercritical state. Note that the processing fluid in the supercritical state may be supplied from outside. By introducing the supercritical fluid into the processing space SP, the organic solvent such as IPA covering the substrate S is replaced by the supercritical fluid. The organic solvent separated from the surface of the substrate S is discharged with the processing fluid in a state dissolved in the processing fluid and removed from the substrate S. That is, the processing fluid in the supercritical state has a function of replacing the organic solvent adhering the substrate S as the liquid to be replaced and discharging it from the chamber 12. By maintaining a state, where the processing space SP is filled with the supercritical fluid, for a predetermined time (Step S103), the liquid to be replaced adhering to the substrate S can be replaced by the processing fluid and discharged from the chamber.

If the replacement of the liquid to be replaced by the supercritical fluid is finished in the processing chamber 12 (Step S104), the processing fluid in the processing space SP is discharged and the substrate S is dried. Specifically, by increasing the discharge amount of the fluid from the processing space SP, the inside of the processing chamber 12 filled with the processing fluid in the supercritical state is decompressed (Steps S105).

In the decompression process, the supply of the processing fluid may be stopped or a small amount of the processing fluid may continue to be supplied. By decompressing the processing space SP from the state filled with the supercritical fluid, the processing fluid undergoes a phase change from the supercritical state to a gas phase. By discharging the vaporized processing fluid to outside, the substrate S is dried. At this time, a decompression rate is regulated so as not to create a solid phase and a liquid phase due to a sudden temperature drop. In this way, the processing fluid in the processing space SP is directly vaporized from the supercritical state and discharged to outside. Therefore, the formation of a gas-liquid interface on the substrate S having the exposed surface after drying is avoided.

As just described, in the supercritical drying process of this embodiment, the liquid adhering to the substrate S can be efficiently replaced and prevented from remaining on the substrate S by changing the phase of the processing fluid to the gas phase and discharging the processing fluid after the processing space SP is filled with the processing fluid in the supercritical state. Moreover, the substrate can be dried while avoiding problems caused due to the formation of the gas-liquid interface such as the contamination of the substrate by adhering impurities and pattern collapse.

The processed substrate S is delivered to a subsequent process (Step S106). That is, the lid member 13 moves in the (−Y) direction, whereby the support tray 15 is pulled out to outside from the processing chamber 12 and the substrate S is transferred to the external conveying device via the transfer unit 30. At this time, the substrate S is in the dried state. The content of the subsequent process is arbitrary. Unless there is a substrate to be processed next (NO in Step S107), the process is finished. If there is another substrate to be processed (YES in Step S107), return is made to Step S101 after a temperature adjustment process (Step S108) described later, the substrate S is newly received and the above process is repeated.

If the next substrate S is successively processed after the process for one substrate S is finished, a tact time can be shortened as follows. That is, after the support tray 15 is pulled out and the processed substrate S is carried out, the support tray 15 is accommodated into the processing chamber 12 after a new unprocessed substrate S is placed thereon. Further, by reducing the number of opening and closing the lid member 13 in this way, an effect of suppressing a temperature change in the processing chamber 12 due to the entrance of outside air is also obtained.

Next, the temperature adjustment processing of Step S108 is described. The density of a fluid in a supercritical state largely changes with respect to temperature. Specifically, the density of the fluid increases as the temperature of the fluid decreases, and the density is largely reduced only by a slight temperature increase. In view of the purpose of the supercritical process of replacing the liquid remaining on and adhering to the substrate by the supercritical processing fluid, it is desirable to perform the process using a high-density processing fluid capable of taking more fluid.

However, the inside of the chamber after the process has a high temperature. Moreover, unless a temperature control is particularly executed, the temperature may be different in each process. If a new substrate is received and the process is performed in such a state, the temperature of the introduced processing fluid largely changes, thereby causing a problem that satisfactory processing results cannot be obtained or processing quality differs for each substrate.

To solve this problem, in this embodiment, a temperature adjustment processing to be described next is performed after the supercritical process for one substrate is finished. By doing so, a new substrate is received after the temperature in the chamber is set to a target temperature.

FIGS. 3A to 3D are diagrams schematically showing the operation of each component in the supercritical process. Further, FIG. 4 is a flow chart showing the temperature adjustment processing. When the process for one substrate by the supercritical processing fluid is finished (Step S105 of FIG. 2), the substrate S is accommodated in the processing space SP while being supported by the support tray 15 as shown in FIG. 3A. In Step S106, the lid member 13 moves in the (−Y) direction and the support tray 15 is pulled out to outside as shown in FIG. 3B. The substrate S is carried out to outside, for example, by a hand H of an unillustrated conveyor robot.

In the temperature adjustment processing performed after the substrate is carried out, the lid member 13 is closed as shown in FIG. 3C. In this way, the processing space SP accommodating the support tray 15 having the substrate S not placed thereon is closed (Step S201). Then, as shown in FIG. 3D, the fluid supplier 57 supplies the processing fluid into the processing space SP and the fluid collector 55 discharges the processing fluid from the processing space SP based on a predetermined supply/discharge recipe. By doing so, the processing space SP is cooled (Step S204).

The processing fluid at this time is introduced for the purpose of cooling the processing chamber 12 and reducing the temperature in the chamber. Note that the temperature of the processing space SP indicates a temperature detected when a temperature detector is disposed in the processing space SP and a measurement is conducted. However, the temperature of the processing space SP can be typically represented by the temperature of the chamber inner wall surface facing the processing space SP. Since a high pressure resistance is required, the processing chamber 12 is, for example, formed by a thick metal block. Thus, the processing chamber 12 has a large heat capacity and the temperature detected in the processing space SP is thought to be substantially equal to the temperature of the wall surface due to radiation and conduction from the wall surface.

However, it may be difficult to arrange the temperature detector facing the processing space SP since the temperature detector possibly becomes a contamination source of the substrate to be processed. In this case, the temperature detector can be provided in a space communicating with the processing space SP, particularly a space downstream of the substrate S in the flowing direction of the processing fluid. The temperature of the fluid filling up this space can be simply regarded as the temperature of the processing space SP. The detectors 173, 174 of this embodiment conform to such a purpose.

A simple method for adjusting the temperature of the processing space SP to the target temperature using the processing fluid is to supply the processing fluid temperature-adjusted based on the target temperature into the processing space SP. Generally, the processing fluid having a lower temperature than the inside of the chamber is supplied to cool the chamber having a high temperature. By causing a sufficient amount of the processing fluid to flow, the temperature of the chamber inner wall surface facing the processing space SP can be brought closer to the target temperature.

However, the chamber internal temperature after the process is not necessarily constant, and it cannot be said to be realistic to adjust the temperature of the processing fluid for the purpose of cooling the inside of the chamber. Accordingly, in this embodiment, the processing chamber 12 is cooled utilizing a temperature drop due to adiabatic expansion at the time of decompression after the pressurized processing fluid is filled into the processing space SP.

Specifically, the chamber internal temperature is obtained (Step S202), and the supply/discharge recipe is determined based on the obtained result (Step S203). The temperature in the chamber is adjusted by controlling the supply (Step S204) and discharge (Step S205) of the processing fluid into and from the processing space SP based on the determined supply/discharge recipe.

By setting an excess supply state in which a supply amount of the processing fluid into the processing space SP is more than a discharge amount of the processing fluid from the processing space SP, the processing fluid is pressurized and compressed in the processing space SP and the temperature thereof increases. On the other hand, the processing space SP is decompressed in an excess discharge state in which the discharge amount is more than the supply amount. At this time, if a discharge rate is high, the processing fluid quickly expands in the processing space SP and the temperature thereof drops due to adiabatic expansion. By quickly reducing the temperature of the processing fluid in the processing space SP in this way, the chamber inner wall surface can be cooled.

FIG. 5 is a chart schematically showing pressure and temperature changes in the chamber in the temperature adjustment processing. A temperature Te in the chamber at time T0 immediately after the substrate S is carried out can take various values for each process. However, this temperature is higher than a target temperature Tt at the start of the next process. The pressure in the chamber at this time is an atmospheric pressure Pa.

At time T1, the supply of the processing fluid is started. The processing fluid at this time may be in either a gas phase or a liquid phase. By introducing the processing fluid in the excess supply state, the processing fluid is compressed and the pressure and temperature in the chamber increase. After a state where the chamber internal pressure is a maximum pressure Pm is maintained for a certain period (time T2 to T3), the excess discharge state is set, whereby the inside of the chamber is decompressed. Due to the adiabatic expansion of the processing fluid, a temperature drop is caused, whereby the chamber inner wall surface is also cooled. Decompression is performed until the chamber internal temperature reaches the target temperature Tt (time T4). Finally, a state where the pressure in the chamber is the atmospheric temperature Pa and the temperature therein is the target temperature Tt is realized.

Note that the processing fluid needs not be set in the supercritical state since this is merely an operation of adjusting the temperature in the chamber. Further, the period during which the pressure is maintained constant may be short. The cooling of the processing chamber 12 in the temperature adjustment processing is not the cooling of the entire processing chamber 12. It is aimed to cool the wall surface facing the processing space SP and a part adjacent to this wall surface, out of the processing chamber 12, to such an extent as not to affect the temperature of the processing fluid to be introduced in the later process.

The chamber internal temperature Te is not necessarily constant when the temperature adjustment processing is started. Thus, the supply/discharge recipe specifying the supply and discharge of the processing fluid needs to be changed according to the temperature Te to set the final temperature to the target temperature Tt regardless of the temperature Te at this time. The supply/discharge recipe is changed to increase the maximum pressure Pm at the time of boosting, for example, as shown by a broken line in FIG. 5. Then, a temperature increase in the chamber becomes large. Thus, this is effective, for example, when the temperature Te is relatively low. A similar effect is obtained also by reducing the discharge rate of the processing fluid at the time of decompression to suppress a temperature drop caused by the adiabatic expansion.

Further, the discharge rate of the processing fluid may be increased, for example, as shown by a dotted line in FIG. 5. Then, a temperature drop by the adiabatic expansion becomes more remarkable and an effect of cooling the processing chamber 12 is enhanced. This is effective when the temperature Te is relatively high. A similar effect is obtained also by reducing the supply amount at the time of boosting to suppress a temperature increase.

As just described, the supply/discharge recipe in the temperature adjustment processing is desirably changed according to the chamber internal temperature Te at the start of the operation and the final target temperature Tt. In this embodiment, a plurality of supply/discharge recipes each specifying the supply rate and supply timing of the processing fluid into the processing space SP and the discharge rate and discharge timing of the processing fluid from the processing space SP are prepared in advance. The supply/discharge recipe selected from those based on the result of the temperature obtained at the start of the operation is performed (Steps S202, S203). Thus, even if the temperature Te at the start of the operation differs, the final chamber internal temperature can be maintained at the target temperature Tt.

These supply/discharge recipes can be prepared by conducting a preliminary experiment of supplying the processing fluid into the closed processing space SP accommodating the support tray 15 not supporting the substrate S with the temperature Te at the start of the operation varied and measuring a temperature change in the chamber at that time. Out of those, the supply/discharge recipe capable of changing the temperature from the temperature Te at the start of the operation to the target temperature Tt may be selected. If the target temperature Tt is made changeable, the supply/ discharge recipe may be determined based on a combination of the temperature Te at the start of the operation and the target temperature Tt.

The next substrate S is received with the temperature in the chamber adjusted to the target temperature Tt in this way, and the processing fluid is introduced. By doing so, the chamber internal temperature at the start of the process is stabilized. Thus, a density change due to a temperature change of the processing fluid is suppressed and stable processing quality can be obtained.

Note that if the supercritical process and a discharge process thereafter are configured to make the chamber internal temperature Te at the end of the process constant, the temperature adjustment processing can be performed by the single supply/discharge recipe determined by the temperature Te at that time and the target temperature Tt. That is, in this case, Steps S202 and S203 can be omitted.

As described above, in this embodiment, the chamber internal temperature is optimized by supplying the processing fluid again into the chamber and discharging this processing fluid after the process, in view of a high temperature in the chamber after the supercritical process, the high temperature being non-constant. In this way, in the embodiment, it is possible to suppress a fluctuation of replacement efficiency due to a large change of the density of the processing fluid by temperature and process a plurality of substrates with stable processing quality.

The temperature adjustment processing is performed with the support tray 15 not supporting the substrate S accommodated in the processing space SP and the lid member 13 closing the opening 121. Thus, the supplied processing fluid can be efficiently utilized for temperature adjustment, and a process accompanying pressurization is also possible. Further, not only the chamber inner wall surface facing the processing space SP, but also the support tray 15 can be adjusted to the target temperature.

As described above, in the substrate processing apparatus 1 of the above embodiment, the processing chamber 12 functions as a "chamber" of the invention and the opening 121 corresponds to an "opening" of the invention. Further, the processing space SP corresponds to an "internal space" of the invention. Further, the support tray 15 and the lid member 13 respectively function as a "support tray" and a "lid part" of the invention. Further, the fluid supplier 57, the fluid collector 55 and the control unit 90 respectively function as a "fluid supplier", a "fluid discharger" and a "controller" of the invention.

Further, in the substrate processing method (FIG. 2) of the above embodiment, Steps S102 to S104 correspond to a "supercritical process step" of the invention. Further, Steps S105, S106 and S108 respectively correspond to a "decompression step", a "carry-out step" and a "temperature adjustment step" of the invention.

Note that the invention is not limited to the above embodiment and various changes other than the aforementioned ones can be made without departing from the gist of the invention. For example, in the above embodiment, the temperature adjustment processing is performed by selecting the optimal one, out of the supply/discharge recipes prepared in advance, and applying the selected one. Instead of this, such a real-time control as to bring the chamber internal temperature to the target temperature Tt may be executed by a feedback control based on the temperature detection result of the processing fluid during the temperature adjustment processing.

Further, it is not supposed in the temperature adjustment processing of the above embodiment that the processing fluid introduced in the gas or liquid phase into the processing space SP transitions to the supercritical state. However, the processing fluid may be discharged after the transition to the supercritical state, for example, to shorten a processing time. At this time, since the substrate S is not present in the processing space SP, a phase change from the supercritical state to the liquid phase is also allowed.

Further, a control of the initial temperature when the first substrate is processed in the case of successively processing the plurality of substrates is not mentioned in the description of the above embodiment. However, the initial temperature at this time is also desirably kept at a proper temperature when processing stability is considered. To this end and to suppress a temperature change due to a disturbance, the substrate processing apparatus 1 may be further provided with a configuration for temperature stabilization. For example, the chamber internal temperature may be optimized by performing the temperature adjustment processing of this embodiment also before the process for the first substrate. Further, for example, a heater may be provided on the surface of or inside the processing chamber 12. Further, the support tray 15 may include a built-in heater.

Further, various chemical substances used in the processing of the above embodiment are some examples, and various other chemical substances can also be used instead of these if those chemical substances conform to the above technical idea of the invention.

As the specific embodiment has been illustrated and described above, the temperature adjustment step can be, for example, configured to cool a wall surface of the chamber facing the internal space by adiabatic expansion of the processing fluid pressurized to a pressure higher than the atmospheric pressure in the processing space in the substrate processing method according to the invention. A temperature drop caused by the adiabatic expansion is an inevitably occurring phenomenon. A decompression control taking this into account can be utilized to set the temperature in the chamber to the target temperature.

In this case, a discharge rate in discharging the processing fluid from the internal space can be set, for example, based on the target temperature or the temperature of the internal space immediately before the processing fluid is introduced. The magnitude of a cooling action due to the adiabatic expansion can be controlled by the discharge rate of the processing fluid from the internal space. Therefore, it is rational to set the discharge rate based on at least one of the temperature at the start of the process and the target temperature to be finally reached.

More specifically, it is, for example, possible to set in advance a plurality of supply/discharge recipes specifying changes of introduction and discharge of the processing fluid into and from the internal space. In the temperature adjustment step, the introduction and discharge of the processing fluid into and from the internal space can be controlled based on one supply/discharge recipe selected based on the temperature of the internal space immediately before the processing fluid is introduced. According to such a configuration, the temperature can be finally adjusted to the target temperature even if the temperature of the processing space before the temperature adjustment is not constant.

As another method, the processing fluid temperature-adjusted according to the target temperature can be introduced into the internal space in the temperature adjustment step. More specifically, the wall surface of the chamber facing the internal space can be cooled by introducing the processing fluid having a temperature lower than the temperature of the internal space. In this way, the temperature can be adjusted using the processing fluid as a heat transport medium, besides the methods by the adiabatic expansion.

Further, a plurality of substrates can be processed in turn by receiving a new unprocessed substrate and performing the supercritical process step after the temperature adjustment step. By performing the temperature adjustment step, the temperature of the internal space of the chamber is kept at the target temperature. Thus, the processing quality of the supercritical process step performed thereafter can be satisfactorily and stably maintained. As just described, the invention achieves a particularly remarkable effect in the case of processing a plurality of substrates in turn using a supercritical processing fluid.

Further, the substrate processing apparatus according to the invention can be further provided with an opening communicating with the internal space and allowing the passage of the substrate in a side surface of the chamber and a lid part for opening and closing the opening, and the processing fluid can be introduced in the temperature adjustment processing with the opening closed by the lid part after the substrate is carried out. According to such a configuration, a process accompanying pressurization is possible by introducing the processing fluid into a closed space formed by closing the opening, and the processing fluid can be efficiently utilized. Further, since the substrate is not present in the processing space, processing conditions of the temperature adjustment processing can be determined without being restricted by influences on the substrate.

Further, for example, a support tray can be further provided which supports the substrate in a horizontal posture and can enter the internal space via the opening, and the temperature adjustment processing can be performed with the support tray accommodated in the internal space. According to such a configuration, the support tray can be adjusted to a similar temperature.

Further, in this case, the support tray may be attached to the lid part. According to such a configuration, the support tray can be inserted into and withdrawn from the processing space integrally with the lid by advancing and retreating movements of the lid part with respect to the opening.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

INDUSTRIAL APPLICABILITY

This invention can be applied to processings in general for processing a substrate using a processing fluid introduced into a chamber. For example, the invention can be suitably applied to a single substrate processing of processing substrates such as semiconductor substrates successively one by one by a supercritical fluid.

REFERENCE SIGNS LIST 1 substrate processing apparatus
12 processing chamber (chamber)
13 lid member (lid part)
15 support tray
55 fluid collector (fluid discharger)
57 fluid supplier
90 control unit (controller)
121 opening
173, 174 detector
S substrate
S102-S104 supercritical process step
S105 decompression step
S106 carry-out step
S108 temperature adjustment step
SP processing space (internal space)

The invention claimed is:

1. A substrate processing method for processing a substrate by a processing fluid in a supercritical state in a chamber, the substrate processing method comprising:
    processing the substrate by the processing fluid in the supercritical state by introducing the processing fluid into an internal space of the chamber accommodating the substrate;
    decompressing the internal space by discharging the processing fluid;
    carrying out the substrate from the chamber; and
    adjusting a temperature of the internal space to a target temperature by introducing the processing fluid into the internal space and discharging the processing fluid from the internal space after the substrate is carried out,
    wherein the adjusting the temperature of the internal space involves cooling a wall surface of the chamber facing the internal space by adiabatic expansion of the processing fluid pressurized to a pressure higher than the atmospheric pressure in the internal space, and
    wherein a discharge rate in discharging the processing fluid from the internal space is set based on the target temperature.

2. The substrate processing method according to claim 1, wherein in the adjusting the temperature of the internal space, the processing fluid of which temperature is adjusted according to the target temperature is introduced into the internal space.

3. The substrate processing method according to claim 2, wherein the wall surface of the chamber facing the internal space is cooled by introducing the processing fluid having a temperature lower than the temperature of the internal space.

4. The substrate processing method according to claim 1, wherein a plurality of substrates are processed in turn by receiving a new unprocessed substrate and processing the unprocessed substrate with the processing fluid after the adjusting the temperature of the internal space.

5. A substrate processing method for processing a substrate by a processing fluid in a supercritical state in a chamber, the substrate processing method comprising:
    processing the substrate by the processing fluid in the supercritical state by introducing the processing fluid into an internal space of the chamber accommodating the substrate;

decompressing the internal space by discharging the processing fluid;

carrying out the substrate from the chamber; and adjusting a temperature of the internal space to a target temperature by introducing the processing fluid into the internal space and discharging the processing fluid from the internal space after the substrate is carried out, wherein the adjusting the temperature of the internal space involves cooling a wall surface of the chamber facing the internal space by adiabatic expansion of the processing fluid pressurized to a pressure higher than the atmospheric pressure in the internal space, and wherein a discharge rate in discharging the processing fluid from the internal space is set based on the temperature of the internal space immediately before the processing fluid is introduced.

6. A substrate processing method for processing a substrate by a processing fluid in a supercritical state in a chamber, the substrate processing method comprising:

processing the substrate by the processing fluid in the supercritical state by introducing the processing fluid into an internal space of the chamber accommodating the substrate;

decompressing the internal space by discharging the processing fluid;

carrying out the substrate from the chamber; and adjusting a temperature of the internal space to a target temperature by introducing the processing fluid into the internal space and discharging the processing fluid from the internal space after the substrate is carried out, wherein the adjusting the temperature of the internal space involves cooling a wall surface of the chamber facing the internal space by adiabatic expansion of the processing fluid pressurized to a pressure higher than the atmospheric pressure in the internal space, and wherein:

a plurality of supply/discharge recipes specifying changes of introduction and discharge of the processing fluid into and from the internal space are set in advance; and in the adjusting the temperature of the internal space, the introduction and discharge of the processing fluid into and from the internal space are controlled based on one supply/discharge recipe selected based on the temperature of the internal space immediately before the processing fluid is introduced.

\* \* \* \* \*